(12) United States Patent
Rehder

(10) Patent No.: US 12,107,177 B2
(45) Date of Patent: Oct. 1, 2024

(54) LIGHTWEIGHT FLEXIBLE SOLAR ARRAY

(71) Applicant: The Boeing Company, Chicago, IL (US)

(72) Inventor: Eric M. Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 200 days.

(21) Appl. No.: 17/484,158

(22) Filed: Sep. 24, 2021

(65) Prior Publication Data
US 2023/0097056 A1    Mar. 30, 2023

(51) Int. Cl.
   *H01L 31/0236* (2006.01)
   *H01L 31/0465* (2014.01)
   *H01L 31/18* (2006.01)

(52) U.S. Cl.
   CPC .... *H01L 31/02366* (2013.01); *H01L 31/0465* (2014.12); *H01L 31/186* (2013.01)

(58) Field of Classification Search
   CPC ................ H01L 31/0465; H01L 31/02366
   See application file for complete search history.

(56) References Cited

U.S. PATENT DOCUMENTS

| | | |
|---|---|---|
| 5,928,437 A | 7/1999 | Dillard |
| 2012/0073623 A1 | 3/2012 | Jones et al. |
| 2018/0076339 A1 | 3/2018 | Rehder |

FOREIGN PATENT DOCUMENTS

WO    WO-2010042981 A1 *  4/2010  ......... H01L 31/0547

OTHER PUBLICATIONS

Extended European Search Report dated Feb. 22, 2023 for EP Application No. 22197124.5.

* cited by examiner

*Primary Examiner* — Lindsey A Buck
(74) *Attorney, Agent, or Firm* — GATES & COOPER LLP

(57) ABSTRACT

At least one solar cell is mounted to a flexible substrate using an adhesive, wherein: the flexible substrate includes at least one insulating layer and at least one conductive layer patterned on the insulating layer as one or more traces for making electrical connections with the solar cell; the traces on the flexible substrate are unencapsulated and at least some of the traces remain exposed after the solar cell is mounted to the flexible substrate; the solar cell is positioned above the traces on the flexible substrate; and a backside metal layer of the solar cell does not make contact to the traces on the flexible substrate when the solar cell is mounted on the flexible substrate. The result is a rollable solar array or panel having a reduced stress energy and a reduced minimum rolling radius as compared to a baseline solar cell mounted to a baseline flexible substrate.

23 Claims, 12 Drawing Sheets

| | Baseline | Change Trace Encapsulation | | Change Adhesive | | Change Solar Cell Encapsulation | | Change Solar Cell Thickness | |
|---|---|---|---|---|---|---|---|---|---|
| Coverglass 22 | 4 mil | No change | 4 mil | No change | 4 mil | Change to overcoat 36 | 1 mil | No change | 1 mil |
| Adhesive 26 | 3 mil | No change | 3 mil | No change | 3 mil | Remove | 0 mil | No change | 0 mil |
| Solar cell 16A, 16B | 4 mil | No change | 4 mil | No change | 4 mil | No change | 4 mil | Solar Cell 16B | 2 mil |
| | | Add backside insulator 31 | 1 mil | No change | 1 mil | No change | 1 mil | No change | 1 mil |
| Adhesive 32 | 6 mil | No change | 6 mil | Change to adhesive 32 | 2.3 mil | No change | 2.3 mil | No change | 2.3 mil |
| Polymer Coversheet 29 | 2 mil | Remove coversheet | 0 mil | No change | 0 mil | No change | 0 mil | No change | 0 mil |
| Adhesive 28 | 2 mil | Remove adhesive 28 | 0 mil | No change | 0 mil | No change | 0 mil | No change | 0 mil |
| Polymer Backsheet 27 | 2 mil | No change | 2 mil | No change | 2 mil | No change | 2 mil | No change | 2 mil |
| Thickness | 23 mil | Thickness | 16.3 mil | Thickness | 16.3 mil | Thickness | 1.3 mil | Thickness | 8.3 mil |
| Relative Stress | 1 | | 76% | | 50% | | 20% | | 13% |
| Relative Stress Energy | 1 | | 57% | | 25% | | 4% | | 2% |

FIG. 8

LIGHTWEIGHT FLEXIBLE SOLAR ARRAY

CROSS REFERENCE TO RELATED APPLICATIONS

This application is related to the following and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,";

U.S. Utility application Ser. No. 15/643,279, filed on Jul. 6, 2017, by Eric Rehder, entitled "REWORK AND REPAIR OF COMPONENTS IN A SOLAR ARRAY,";

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 16/991,589, filed on Aug. 12, 2020, by Eric Rehder, entitled "NANO-METAL CONNECTIONS FOR A SOLAR CELL ARRAY,", which is a divisional of U.S. Utility application Ser. No. 15/643,287, filed on Jul. 6, 2017, by Eric Rehder, entitled "NANO-METAL CONNECTIONS FOR A SOLAR CELL ARRAY,", now U.S. Pat. No. 19,763,383, issued Sep. 1, 2020; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following commonly-assigned provisional applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR CELL ARRAY,";

U.S. Provisional Application Ser. No. 62/394,629, filed on Sep. 14, 2016, by Eric Rehder, entitled "MULTILAYER CONDUCTORS IN A SOLAR CELL ARRAY,";

U.S. Provisional Application Ser. No. 62/394,632, filed on Sep. 14, 2016, by Eric Rehder, entitled "REWORK AND REPAIR OF COMPONENTS IN A SOLAR CELL ARRAY,";

U.S. Provisional Application Ser. No. 62/394,649, filed on Sep. 14, 2016, by Eric Rehder, entitled "POWER ROUTING MODULE FOR A SOLAR CELL ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application also is related to the following and commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH,"; and U.S. Utility application Ser. No. 15/787,304, filed on Oct. 18, 2017, by Eric Rehder, entitled "SOLAR CELL ARRAY WITH BYPASSED SOLAR CELLS,";

both of which applications claim the benefit under 35 U.S.C. Section 119(e) of commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH,"; and U.S. Provisional Application Ser. No. 62/518,131, filed on Jun. 12, 2017, by Eric Rehder, entitled "SOLAR CELL ARRAY WITH BYPASSED SOLAR CELLS,";

all of which applications are incorporated by reference herein.

In addition, this application also is related to the following and commonly-assigned applications:

U.S. Utility application Ser. No. 15/938,787, filed on Mar. 28, 2018, by Eric Rehder, entitled "SINGLE SHEET FOLD-OUT SOLAR ARRAY,"; and U.S. Utility application Ser. No. 15/938,791, filed on Mar. 28, 2018, by Eric Rehder, entitled "WIRING FOR A RIGID PANEL SOLAR ARRAY,";

both of which applications are incorporated by reference herein.

This application also is related to the following and commonly-assigned applications:

U.S. Utility application Ser. No. 16/847,032, filed on Apr. 13, 2020, by Eric Rehder, entitled "SOLAR ARRAY ATTACHMENT,"; and U.S. Utility application Ser. No. 16/847,359, filed on Apr. 13, 2020, by Eric Rehder, entitled "STACKED SOLAR ARRAY,";

both of which applications are incorporated by reference herein.

In addition, this application is related to the following and commonly-assigned application:

U.S. Utility application Ser. No. 17/100,823, filed on Nov. 21, 2020, by Eric Rehder, entitled "SPACE SOLAR CELL ARRAY WITH CUSTOM VOLTAGE,";

which application is incorporated by reference herein.

BACKGROUND INFORMATION

1. Field

The disclosure is related generally to solar cells, and more specifically, to a lightweight flexible solar array.

2. Background

A typical spaceflight-capable solar array or panel assembly involves building arrays of solar cells mounted on substrates, wherein the solar cells are electrically interconnected. There are four main components in existing known solar arrays:
1. Conventional substrates include traces under the solar cell are covered by an adhesive and a polymer insulator layer
2. Conventional solar arrays are built using liquid silicone adhesives for bonding solar cells that are 6-12 mil (0.006"-0.012") thick.
3. Conventional solar cells are encapsulated with a piece of coverglass to protect the solar cell from the space environment. This coverglass is usually 0.004" or more thick, and is attached to the solar cell with 0.003" of silicone adhesive.
4. Conventional solar cells are 0.006" thick.

When the solar cells are mounted on the substrate, they are often rolled, folded, or otherwise compacted for storage, and then extended and deployed for operation.

The minimum radius for rolling is governed by the stress energy that leads to cracking and breaks to solar cells.

SUMMARY

To overcome the limitations described above, and to overcome other limitations that will become apparent upon reading and understanding the present specification, the present disclosure describes mounting at least one solar cell to a flexible substrate using an adhesive, wherein: the flexible substrate includes at least one insulating layer and at least one conductive layer patterned on the insulating layer as one or more traces for making electrical connections with the solar cell; the traces on the flexible substrate are unencapsulated and at least some of the traces remain exposed after the solar cell is mounted to the flexible substrate; the solar cell is positioned above the traces on the flexible substrate; and a backside metal layer the solar cell does not make contact to the traces on the flexible substrate when the solar cell is mounted on the flexible substrate. The result is a rollable solar array or panel having a reduced stress energy and a reduced minimum rolling radius as compared to a baseline solar mounted to a baseline flexible substrate.

DRAWINGS

Referring now to the drawings in which like reference numbers represent corresponding parts throughout:

FIG. 8 is a table showing how an unencapsulated trace with a transparent insulator coating on a solar cell can reduce stress energy.

DETAILED DESCRIPTION

In the following description, reference is made to the accompanying drawings which form a part hereof, and in which is shown by way of illustration a specific example in which the disclosure may be practiced. It is to be understood that other examples may be utilized, and structural changes may be made without departing from the scope of the present disclosure.

Overview

The minimum radius for rolling is governed by the stress energy that leads to cracking and breaks to solar cells. Stress energy is related to thickness to the fourth exponent. A problem exists concerning how to adjust the stress energy such that the limitations on the minimum radius for rolling an array is further reduced.

An important metric for a solar array is the stowage volume, which is expressed in Watts per cubic meter ($W/m^3$), and the mass, which is expressed in Watts per kilogram (W/kg). Increasing both of these is highly desirable.

Thus, there is a need for a lightweight flexible solar array with an improved minimum radius for rolling the array, as well as having an improved stowage volume and mass.

This disclosure describes an improved solar array or solar panel that is thinner because multiple components are removed, and thus is lightweight as compared to prior solar arrays and solar panels. This results in a higher stowage mass, W/kg than is presently possible.

This disclosure also describes an improved solar array or solar panel that is flexible with an improved minimum radius for rolling the solar array or solar panel while stowed. With the proposed assembly of this disclosure, it is possible to reduce the thickness from 0.023" to 0.008" (36%). This reduces the stress energy to 2% and will allow a higher stowage volume, $W/m^3$, to be achieved.

The proposed solution of this disclosure is best described using the following schematics.

Spacecraft

Figure 1:
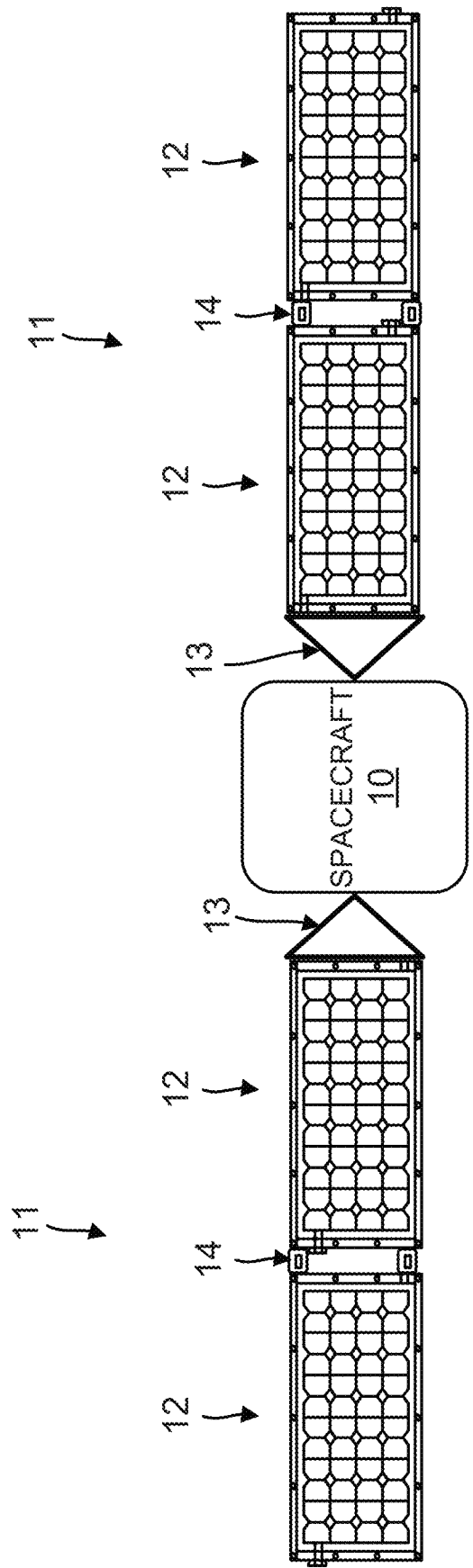
FIG. 1 is a schematic of a spacecraft with one or more solar arrays comprised of one or more solar panels.

FIG. 1 is a schematic of a spacecraft 10 with one or more solar arrays 11 comprised of one or more solar panels 12. In this example, the spacecraft 10 comprises a satellite, and there are two (2) solar arrays 11, and four (4) solar panels 12, wherein each of the solar arrays 11 is comprised of two of the solar panels 12, and the solar arrays 11 and solar panels 12 extend on both sides of the spacecraft 10. The solar arrays 11 are attached to the spacecraft 10 by means of triangular trusses 13 or other mechanisms, and each of the solar panels 12 is attached to an adjacent solar panel 12 by means of hinges 14 or other mechanisms, wherein the triangular trusses 13 and hinges 14 allow the solar arrays 11 and solar panels 12 to be rolled, folded, or otherwise compacted for storage during launch, and then extended and deployed during operation.

Solar Panel

Figure 2:
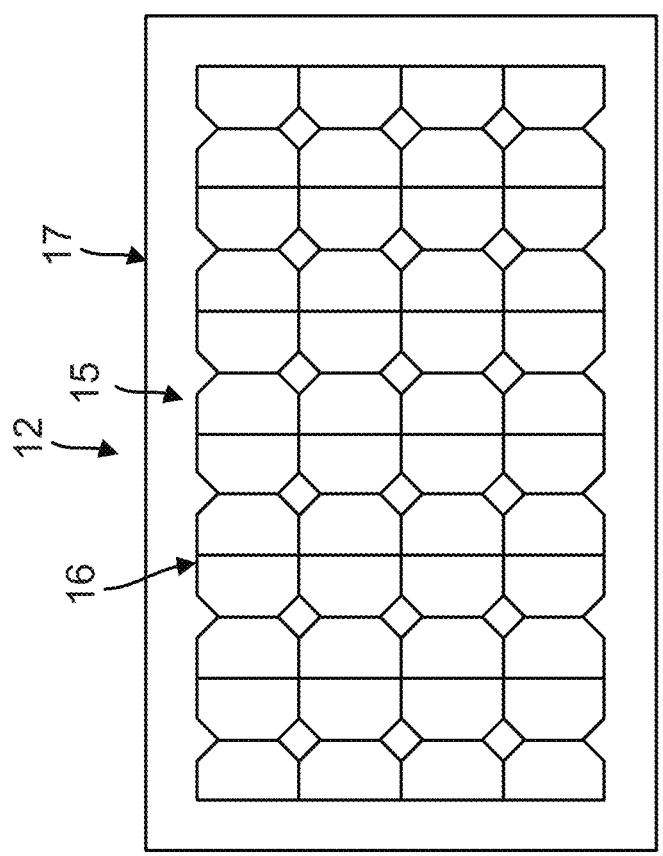
FIG. 2 is a top-view schematic illustrating the components and assembly of one of the solar panels.

FIG. 2 is a top-view schematic illustrating the components and assembly of one of the solar panels 12, including a solar power module (SPM) 15, which is comprised of an array of solar cells 16 bonded to a flexible substrate 17. In one example, the flexible substrate 17 (e.g., a flexible circuit) is comprised of a laminate of at least one polymer insulating layers and at least one metal conductive layers for making electrical connections.

Baseline Solar Cells and Flexible Substrates

Figure 3:
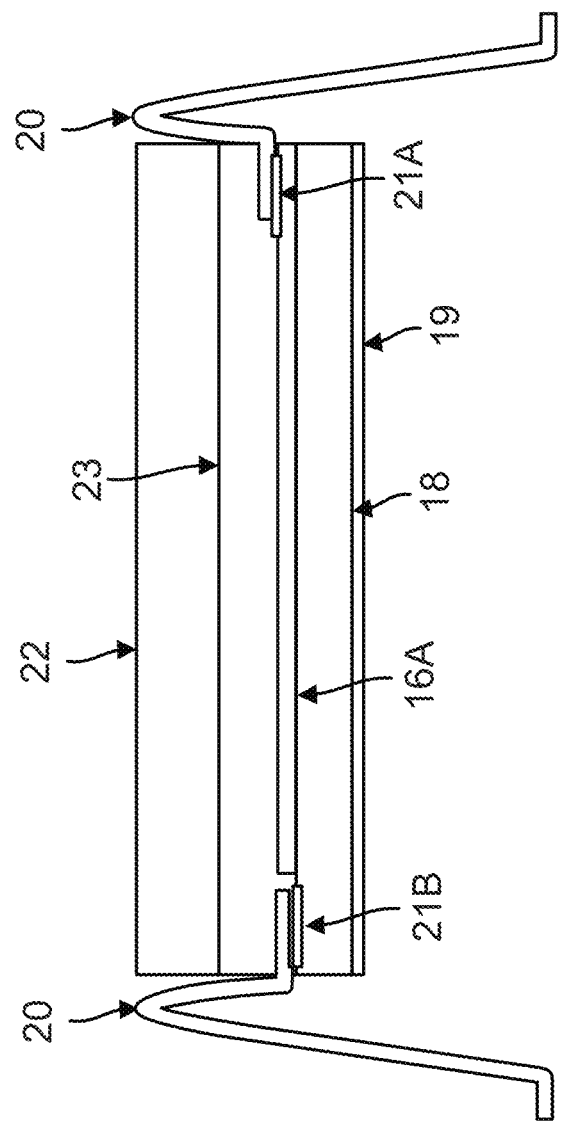
FIG. 3 is a schematic illustrating a baseline structure of a thick solar cell.

FIG. 3 is a schematic illustrating a baseline structure of a device comprising a 6 mil thick solar cell 16A, which is typical, and the solar cell 16A can be thinned to 4 mil with known processes. The solar cell 16A includes a Germanium (Ge) substrate 18, wherein a backside metal layer 19 is deposited on the Ge substrate 18. Metal foil interconnects 20 are welded to and electrically connect contacts 21A, 21B on the solar cell 16A and the Ge substrate 18, respectively. A 4 mil thick coverglass 22 is attached to the top of the solar cell 16 by means of a 3 mil thick adhesive 23.

Figure 4:
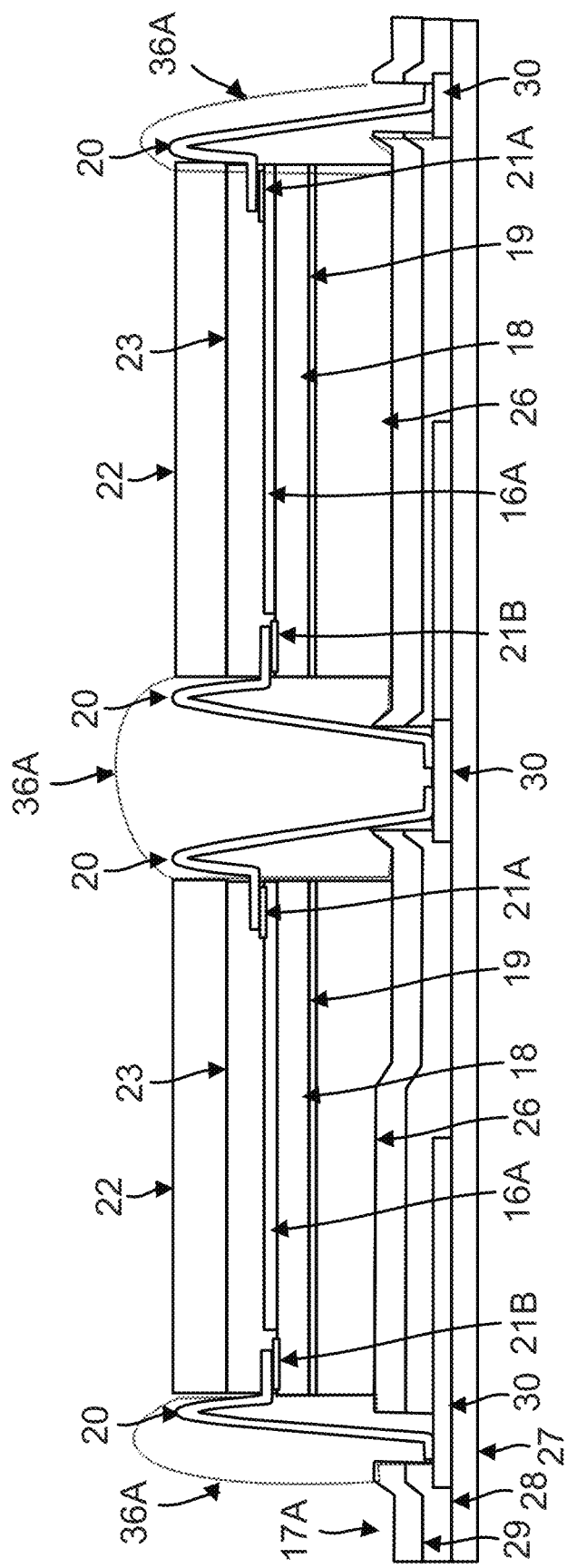
FIG. 4 is a schematic illustrating two of the solar cells of FIG. 3 mounted on a baseline substrate.

FIG. 4 is a schematic illustrating two of the solar cells 16A of FIG. 3 mounted on a baseline flexible substrate 17A using a 6 mil thick adhesive 26, wherein the flexible substrate 17A is comprised of a 2 mil thick polymer backsheet 27, wherein the polymer comprises Kapton™, a 2 mil thick adhesive 28, and a 2 mil thick polymer coverlayer 29, again wherein the polymer comprises Kapton™. Copper (Cu) traces 30 are embedded in the flexible substrate 17A between the polymer backsheet 27 and polymer coverlayer 29, and exposed by openings in the polymer coverlayer 29 and adhesive 28, and the metal foil interconnects 20 are welded to and electrically connect the traces 30. A transparent insulator overcoat 36A is applied to the metal foil interconnects 20 manually, for example, with a paint brush, which takes extensive effort.

Using these baseline structures, the total thickness from the polymer backsheet 27 to the coverglass 22 is 23 mil, which is the sum of the following: 2 mil polymer backsheet 27+2 mil adhesive 28+2 mil polymer coversheet 29+6 mil adhesive 26+4 mil solar cell 16A+3 mil adhesive 23+4 mil coverglass 22.

Improved Solar Cells and Flexible Substrate

Figure 5:
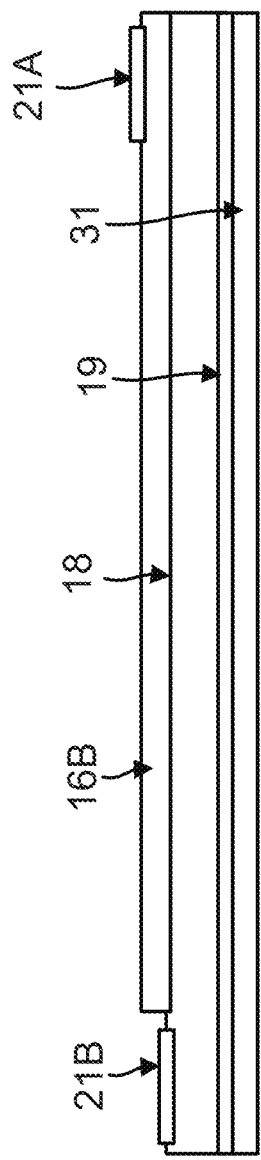
FIG. 5 is a schematic illustrating an improved structure of a thick solar cell.

FIG. 5 is a schematic illustrating an improved structure of a device comprising a 2 mil thick solar cell 16B, including a Ge substrate 18, a backside metal layer 19 deposited on the Ge substrate 18 to provide a low resistance path to carry current across the solar cell 16B, contacts 21A, 21B on the solar cell 16B and the Ge substrate 18, respectively, for making electrical connections, and a backside insulator 31 deposited on the backside metal layer 19 to insulate the backside metal layer 19.

Figure 6:
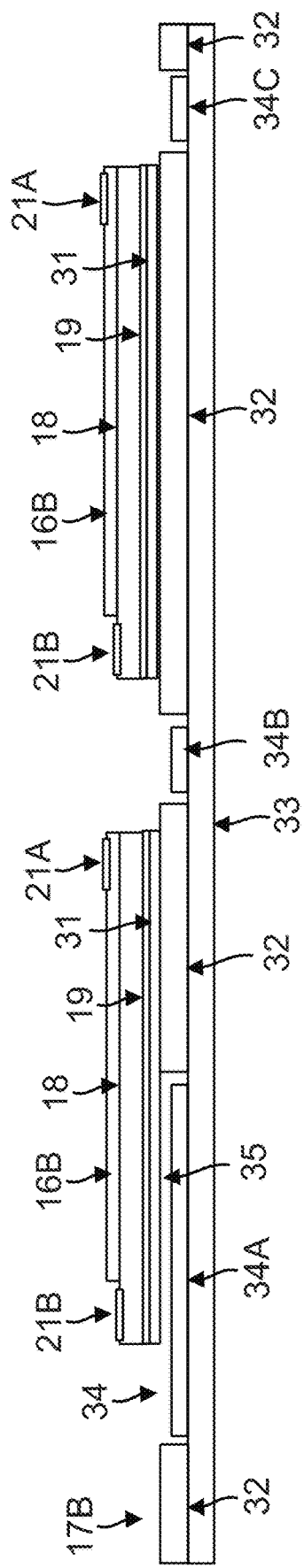
FIG. 6 is a schematic illustrating two of the solar cells of FIG. 5 mounted on an improved structure of a substrate.

FIG. 6 is a schematic illustrating two of the solar cells 16B of FIG. 5 mounted on an improved structure of a flexible substrate 17B using a 2.3 mil thick adhesive 32, wherein the flexible substrate 17B is comprised of at least one insulating layer 33, which is a 2 mil thick polymer backsheet 33, which can be Kapton™, and at least one metal conductive layer 34, which can be for example a 1 oz Cu layer, patterned on the surface of the polymer backsheet 33 as one or more traces 34A, 34B, 34C for making electrical connections with the solar cells 16B.

In this example, the traces 34A, 34B, 34C are unencapsulated and are not embedded in the flexible substrate 17B, but remain exposed before the solar cells 16B are mounted on the flexible substrate 17B. After the solar cells 16B are mounted on the flexible substrate 17B, the traces 34B, 34C remain completely exposed, while the trace 34A remains partially exposed and partially covered by the one of the solar cells 16B. In other examples, the trace 34A may be completely covered by the one of the solar cells 16B. Moreover, even when the trace 34A is partially or completely covered by one of the solar cells 16B, there remains a gap 35 between the trace 34A and the one of the solar cells 16B covering the trace 34A, so that the backside metal layer 19 of the one of the solar cells 16B does not contact the metal traces of the flexible substrate 17B when the one of the solar cells 16B is mounted on the flexible substrate 17B.

Figure 7:
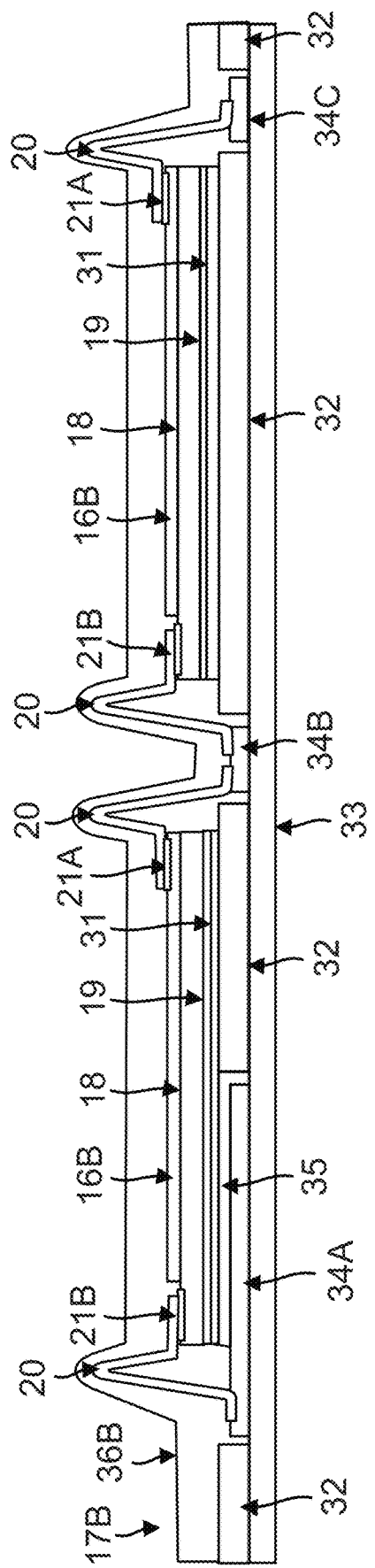
FIG. 7 is a schematic illustrating two of the solar cells mounted on the substrate of FIG. 6.

FIG. 7 is a schematic illustrating two of the solar cells 16B mounted on the flexible substrate 17B of FIG. 6. The metal foil interconnects 20 are welded to and electrically connect contacts 21A, 21B on the solar cell 16B and the Ge substrate 18, respectively, and the metal foil interconnects 20 are also welded to and electrically connect the traces 34A, 34B and 34C. In other examples, the metal foil interconnects 20 can be ultrasonically bonded to, wire bonded to, printed on, etc., to the contacts 21A, 21B, and the traces 34A, 34B, 34C. Thereafter, the entire assembly is encapsulated using a 1 mil transparent insulator overcoat 36B.

The structure illustrated in FIG. 7 has several advantages over the structure illustrated in FIG. 4. As individual changes, they have limited value, but together they reinforce each other and produce a desirable structure.

Solar cells 16 are optimized to produce electrical power from sunlight. Backside electrical contacts are common as they move sunlight blocking structures to the backside. In FIG. 7, the structure adds the contacts 21A, 21B to the frontside of the solar cell 16B, which blocks additional sunlight, reducing power. This is undesirable, but provides advantages for a low mass and flexible structure.

Without contacts on the backside of the solar cell 16B, it is now possible to apply a thin backside insulator 31 during fabrication of the solar cell 16B. This is a simple reliable process. This backside insulator 31 allows for the removal of the polymer backsheet 27 and adhesive 28 in FIG. 4. The polymer backsheet 27 and adhesive 28 are thicker and have greater area coverage than the backside insulator 31. Thus change to the backside insulator 31 reduces thickness and mass.

Space solar cells 16A typically have metal contacts 21A, 21B and coverglass 22 added, and then these are assembled together to form the solar panel 12. These traditional manufacturing steps requires extensive handling of the solar cell 16A. Thin solar cells 16B (<0.006") become very fragile and reducing handling is critical to preserve yield. The structure in FIG. 7 allows for a manufacturing process that minimizes handling and maximizes yield of the thin solar cell 16B. The thin solar cell 16B can immediately be adhered to the flexible substrate 17B. Metal foil interconnects 20 between the solar cell 16B and traces 34A, 34B, 34C on the flexible substrate 17B can be added after the solar cell 16B is mounted on and supported by the flexible substrate 17B. Furthermore, spray-on encapsulation of the transparent insulator overcoat 36B is added.

The spray-on encapsulation of the transparent insulator overcoat 36B provides multiple benefits. It provides insulation and radiation protection to the solar cell 16B similar to a conventional coverglass 22. It also provides insulation to the edges of the solar cell 16B, to the metal foil interconnects 20 between the solar cell 16B and the traces 34A, 34B, 34C on the flexible substrate 17B, and insulation to the exposed traces 34A, 34B, 34C on the flexible substrate 17B. These are otherwise accomplished by manual steps to apply silicone coatings, such as the transparent insulator overcoat 36A, which requires extensive labor and results in larger quantities and mass of material.

The spray-on encapsulation of the transparent insulator overcoat 36B provides less shielding of protons than a traditional coverglass 22 layer. This would lead to solar cell 16B power loss in some space environments. On the other hand, the spray-on encapsulation of the transparent insulator overcoat 36B is advantageous in protection against electrostatic discharge (ESD) and attack by atomic oxygen (AO), both of which can be important concerns in some space environments. Encapsulation can always be achieved manually with enough effort to apply, inspect, and touchup coatings. However, the spray-on encapsulation technique is much simpler to achieve the full coverage.

The solar cell 16B thickness, coverglass 22, and flexible substrate 17B insulation are all reduced in FIG. 7 as compared to FIG. 4. This is accomplished with a process that reduces handling and can be automated. Thus, labor and attrition costs are attractive, as well as the reduced thickness, increased flexibility, and low mass.

Mass reduction of the assembly is often a challenge, as there are many components. Extensive efforts can be taken to reduce the mass of one item, but the overall assembly mass has limited change due to the other components. These multiple new structures combine synergistically to reduce their individual masses and realize mass reduction at the overall assembly level.

Using these improved structures, the total thickness from the polymer backsheet 33 to the transparent insulator overcoat 36 is 8.3 mil: 2 mil polymer backsheet 33+2.3 mil adhesive 32+1 mil backside insulator 31+2 mil solar cell 16+1 mil transparent insulator overcoat 36.

These improved structures of FIGS. 5, 6 and 7, incorporate a number of changes set forth below, wherein the evolution of the thickness through these changes is shown in the table of FIG. 8.

Traces

The traces 34A, 34B, 34C on the flexible substrate 17B are left unencapsulated and at least some of the traces 34A, 34B, 34C, remain exposed after the solar cell 16B is mounted to the flexible substrate 17B. The adhesive 32 is positioned adjacent to the traces 34A, 34B, 34C on the flexible substrate 17B, without covering the traces 34A, 34B, 34C, when mounting the solar cell 16B on the flexible substrate 17B.

A useful combination is a 1 oz Cu layer 34 for the traces 34A, 34B, 34C, which has a thickness of 0.0014". The adhesive 32 could be 3M 966™, which has a thickness of 0.0023". Thus, the surface of the backside metal layer 19 of the solar cell 16B is positioned 0.0009" above the Cu layer 34 and the traces 34A, 34B, 34C on the flexible substrate 17B.

A liquid silicone adhesive could be employed as an alternative to the 3M 966™ sheet adhesive 32. The liquid can flow and conform to an uneven topology. Thus, a liquid silicone could extend to the narrower gap between the traces 34A, 34B, 34C and the solar cell 16B.

The current in the solar cell 16B must transport across the Ge substrate 18 to the contact 21B. The resistance of the Ge substrate 18 will consume >0.1%, especially if the solar cell 16B is thinned to less than a conventional 0.006" thickness. To reduce this power loss, the solar cell 16B has the metal layer 19 on the backside to provide a low resistance path to carry the current across the solar cell 16B. The backside metal layer 19 is 0.0009" above the traces 34A, 34B, 34C of the flexible substrate 17B.

There is a risk of inadvertent electrical contact between the traces 34A, 34B, 34C and the metal layer 19 on the backside of the solar cell 16B. In some designs, at least one of the trace 34A, 34B, 34C will be deliberately electrically connected to the backside metal layer 19 of the solar cell 16B. It may also be possible to pattern the backside metal layer 19 to eliminate the risk of inadvertent metal-to-metal electrical contact when the solar cell 16B is positioned over the traces 34A, 34B, 34C.

Greater protection against the risk of inadvertent electrical contact can be obtained by applying the backside insulator 31 to the backside metal layer 19 of the solar cell 16B. This can be readily accomplished using a wafer-level process, such as a spin-on process using polyimide or numerous other polymer, spin-on-glass, or oxide coatings. In such a case, it would be advantageous to have the contact 21B of the Ge substrate 18 made through access from the front side of the solar cell 16B.

As mentioned above, a 0.0009" gap 35 exists between the solar cell 16B and the trace 34A on the flexible substrate 17B when the solar cell 16B is mounted on the flexible substrate 17B. This gap 35 must not be trapped but vented, either out edges of the solar cell 16B or through channels or pinholes through the polymer backsheet 33.

Consequently, a rollable solar array 11 using the improved solar cells 16B and improved flexible substrate 17B has a reduction in overall thickness of at least about 36% and reduced stress energy of about 2% when rolled.

Adhesive

Silicones have shown great ability to survive in the space environment and are used almost exclusively for bonding solar cells 16A to the flexible substrate 17A. These have traditionally only been available in liquid form. It is difficult to ensure reproducible results with thin layers of these silicones, which generally limits their thickness to at least a 0.006" thickness.

Sheet adhesives are available that have a thickness below 0.006". A variety of silicone and acrylic materials are available with a wide range of outgassing rates, temperature stability, and radiation stability. These can be used for many missions.

One of the thinner materials is 3M 966™, which has a thickness of 0.0023". Using this material for the solar cell 16B adhesive 32 reduces the thickness from 0.006" for the adhesive 26 to 0.0023" for the adhesive 32. A lower thickness also has greater thermal conductance, which is desirable as well.

Transparent Insulator Coating

Space solar cells 16A are generally assembled with welded metal foil interconnects 20 and a coverglass 22 bonded with adhesive 23. This is known a CIC (cell-interconnect-coverglass). The coverglass 22 and adhesive 23 contributes 0.007" to the CIC thickness. This CIC is then assembled onto the solar array 11 or solar panel 12.

The improved structures use a transparent insulator overcoat 36 to replace the coverglass 22. The process has the solar cell 16B bonded to the solar array 11 or solar panel 12 with metal foil interconnects 20 applied. The metal foil interconnects 20 could be attached before or after attachment of the solar cell 16B to the solar array 11 or solar panel 12. The metal foil interconnects 20 could be welded metal foil tabs or a range of others including: ultrasonic bonded metal foil tabs, soldered metal foil tabs, ultrasonic wire bonding, or metal printing.

The critical element is that, at the solar array 11 or solar panel 12 level, the transparent insulator overcoat 36 is applied that is <0.007" thick. The transparent insulator overcoat 36 could be spray or aerosol coated through many methods and could involve ceramic, glass, or polymer constituents or a mix of them.

Higher areal density of this transparent insulator overcoat 36 ($kg/m^2$) is useful for stopping electron and proton radiation in the space environment. It is also desirable to withstand atomic oxygen (AO) erosion. It must of course be transparent to AM0 illumination and not darken due to this illumination, especially the ultraviolet exposure. There are a variety of options for high transparency with low AO erosion.

The thin transparent insulator overcoat 36 in most cases has a $kg/m^2$ less than the coverglass 22 with less radiation protection. This is well characterized and predictable, and its use can be evaluated for each mission. Shorter term missions and low earth orbit missions have less radiation, and will be applicable to the transparent insulator overcoat 36 instead of the coverglass 22. Additionally, low earth orbit missions can have high O fluence, making this erosion rate an important factor to consider.

There are often exposed metal elements on the solar array 11 or solar panel 12 covered with an insulator material, which is often a silicone adhesive. A broad area transparent insulator overcoat 36 for the solar cells 16B could also serve this purpose of having an insulator material over exposed metal elements.

Solar Cell

The baseline solar cell 16A typically has a thickness of 0.006". The improved solar cell 16B can be thinned further to almost any thickness. Subsequent handling and processing of the wafer and solar cell 16B gets more difficult as it becomes thinner.

The contact 21B on the Ge substrate 18 is generally made on the back side of the solar cell 16B (away from the Sun). Moving the contact 21B on the Ge substrate 18 to the front side of the solar cell 16B limits this handling, which is desirable for processing thin solar cells 16B. As mentioned above, having the contact 21B on the front side of the Ge substrate 18 is also desirable when using the backside insulator 31 to reduce the risk of inadvertent electrical contact.

The stress energy (e.g., during bending and rolling) increases by the thickness squared. This stress energy can reduce the power output from undesirable effects, such as cracking of solar cells 16A, delamination of layers, breaking of electrical connections, among others. Minimizing the stress energy can improve reliability of the solar array 11 or solar panel 12.

Thicknesses

The table in FIG. 8 shows how unencapsulated traces 34A, 34B, 34C with a transparent insulator overcoat 36 on the solar cell 16B can reduce the stress energy to 57% of the baseline structures. This can be integrated with the features described above, for example, to reduce the stress energy to 2% of the baseline structures.

Fabrication

Figure 9:
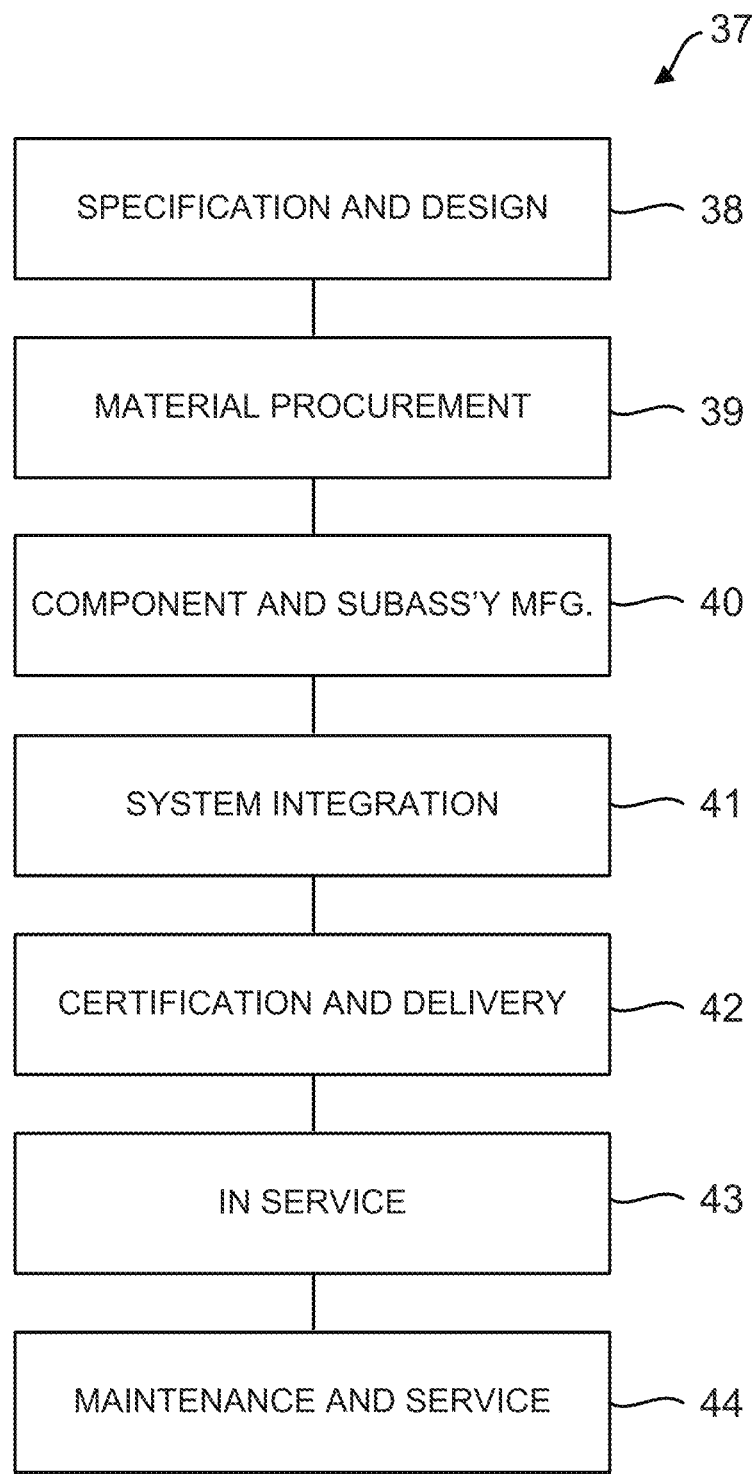
FIG. 9 illustrates a method of fabricating an apparatus comprising a solar array for a spacecraft.
Figure 10:
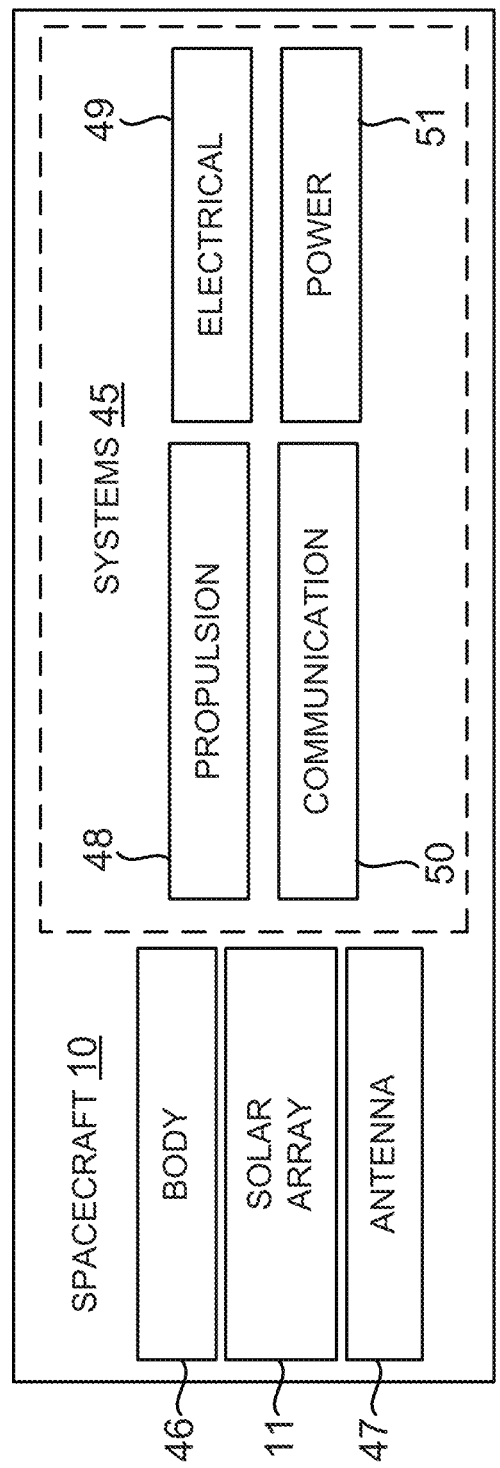
FIG. 10 illustrates the resulting apparatus comprising a spacecraft with a solar array.

Examples of the disclosure may be described in the context of a method 37 of fabricating an apparatus comprising the solar array 11 for the spacecraft 10, the method 37 comprising steps 38-44, as shown in FIG. 9, wherein the resulting spacecraft 10 having the solar array 11 is shown in FIG. 10.

As illustrated in FIG. 9, during pre-production, exemplary method 37 may include specification and design 38 of the spacecraft 10 and/or solar array 11, and material procurement 39 for same. During production, component and subassembly manufacturing 40 and system integration 41 of the spacecraft 10 and/or solar array 11 takes place, which include fabricating the spacecraft 10 and/or solar array 11, including mounting one or more solar cells 16B to the flexible substrate 17B, and then attaching the flexible substrate 17B and the solar cells 16B to the solar array 11. Thereafter, the spacecraft 10 and/or solar array 11 can go through certification and delivery 42 in order to be placed in service 43. The spacecraft 10 and/or solar array 11 can also be scheduled for maintenance and service 44 (which includes modification, reconfiguration, refurbishment, and so on), before being launched.

Each of the processes of method 37 can be performed or carried out by a system integrator, a third party, and/or an operator (e.g., a customer). For the purposes of this description, a system integrator can include without limitation any number of solar cell 16B, flexible substrate 17B, solar panel 12, solar array 11 or spacecraft 10 manufacturers and major-system subcontractors; a third party may include without limitation any number of venders, subcontractors, and suppliers; and an operator may be a satellite company, military entity, service organization, and so on.

As shown in FIG. 10, a spacecraft 10 fabricated by exemplary method 37 can include systems 45, a body 46, one or more solar arrays 11, and one or more antennae 47. Examples of the systems 45 included with the spacecraft 10 include, but are not limited to, one or more of a propulsion system 48, an electrical system 49, a communications system 50, and a power system 51. Any number of other systems 45 also may be included.

Operation

Figure 11:
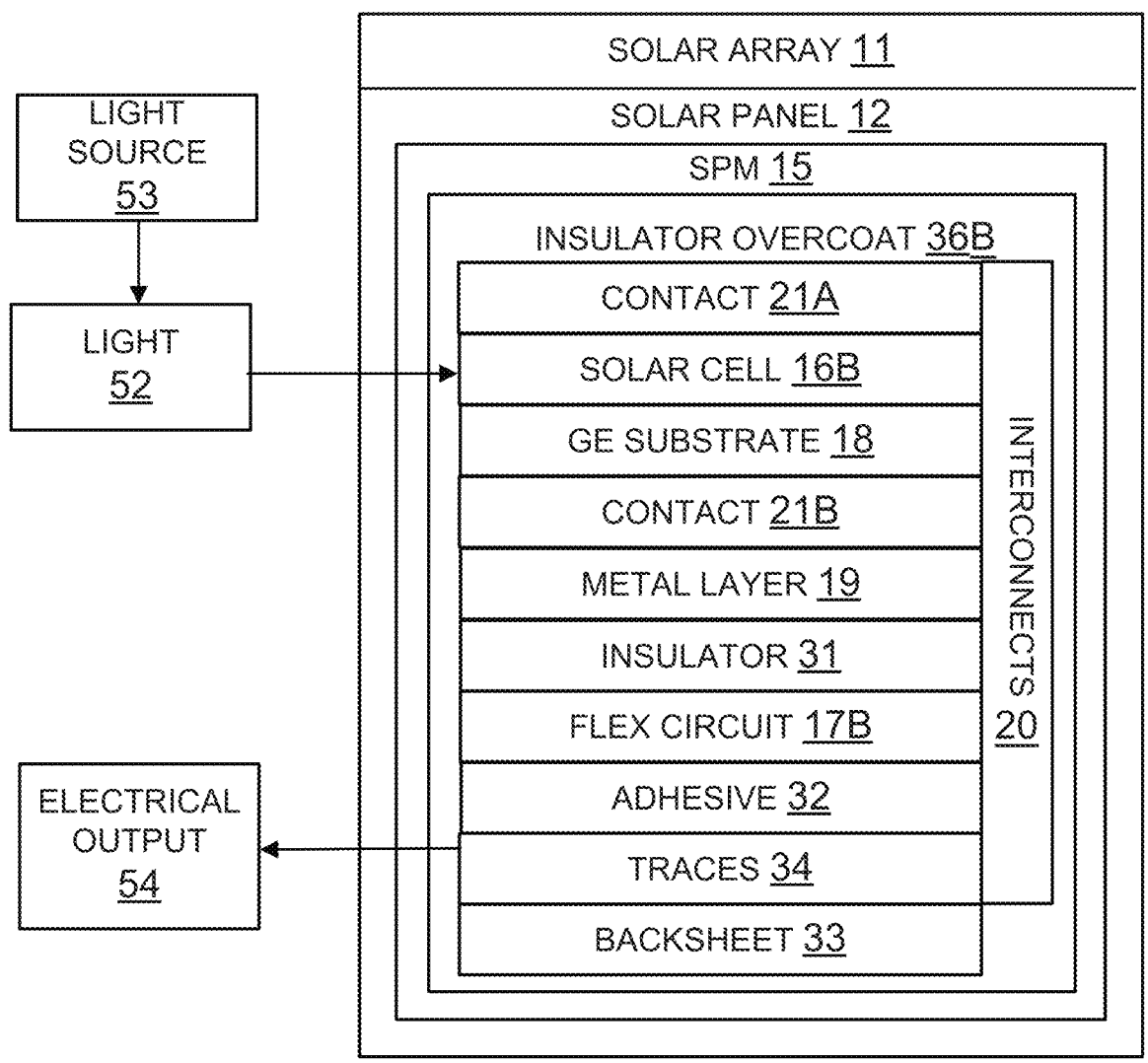
FIG. 11 is an illustration of a method of operating the solar array, in the form of a functional block diagram.

FIG. 11 is an illustration of a method of operating the solar array 11 or solar panel 12, in the form of a functional block diagram, according to one example. The solar array 11 is comprised of one or more solar panels 12, wherein each of the solar panels 12 includes one or more of the SPMs 15 and each of the SPMs 15 is comprised of one or more solar cells 16B mounted on a flexible substrate 17B using an adhesive 32.

The solar array 11 or panel 12 is a rollable solar array 11 or solar panel 12 having a reduced stress energy and a reduced minimum rolling radius as compared to a baseline solar cell 16A mounted on a baseline flexible substrate 17A. Specifically, the solar array 11 or solar panel 12 has a reduction in overall thickness by at least 36% and reduced stress energy of about 2%.

The solar cell 16B includes a Germanium (Ge) substrate 18, the Ge substrate 18 has a backside metal layer 19 to provide a low resistance path to carry current across the solar cell 16B, and a backside insulator 31 is deposited on the backside metal layer 19. The solar cell 16B has a thickness less than 0.006".

The flexible substrate 17B includes at least one insulating layer 33 and at least one conductive layer 34 patterned on the insulating layer 33 as one or more traces 34A, 34B, 34C, for making electrical connections with the solar cell 16B. The adhesive 32 is positioned adjacent to the traces 34A, 34B, 34C on the flexible substrate 17B when mounting the solar cell 16B on the flexible substrate 17B. The adhesive 32 has a thickness of 0.0023".

The traces 34A, 34B, 34C comprise a 1 oz copper layer having a thickness of 0.0014". The traces 34A, 34B, 34C on the flexible substrate 17B are unencapsulated and at least some of the traces 34A, 34B, 34C remain exposed after the solar cell 16B is mounted to the flexible substrate 17B.

The solar cell 16B, the Ge substrate 18, the backside metal layer 19 and the backside insulator 31 are positioned 0.009" above the traces 34A, 34B, 34C on the flexible substrate 17B after the solar cell 16B is mounted to the flexible substrate 17B. A gap 35 exists between the backside insulator 31 and the traces 34A on the flexible substrate 17B when the solar cell 16B is mounted on the flexible substrate 17B at least partially covering the traces 34A, but at least one of the traces 34A, 34B, 34C may be electrically connected to the backside metal layer 19 of the solar cell 16B.

When operating, each of the solar cells 16B absorbs light 52 from a light source 53 and generates an electrical output 54 in response thereto.

Process

Figure 12:
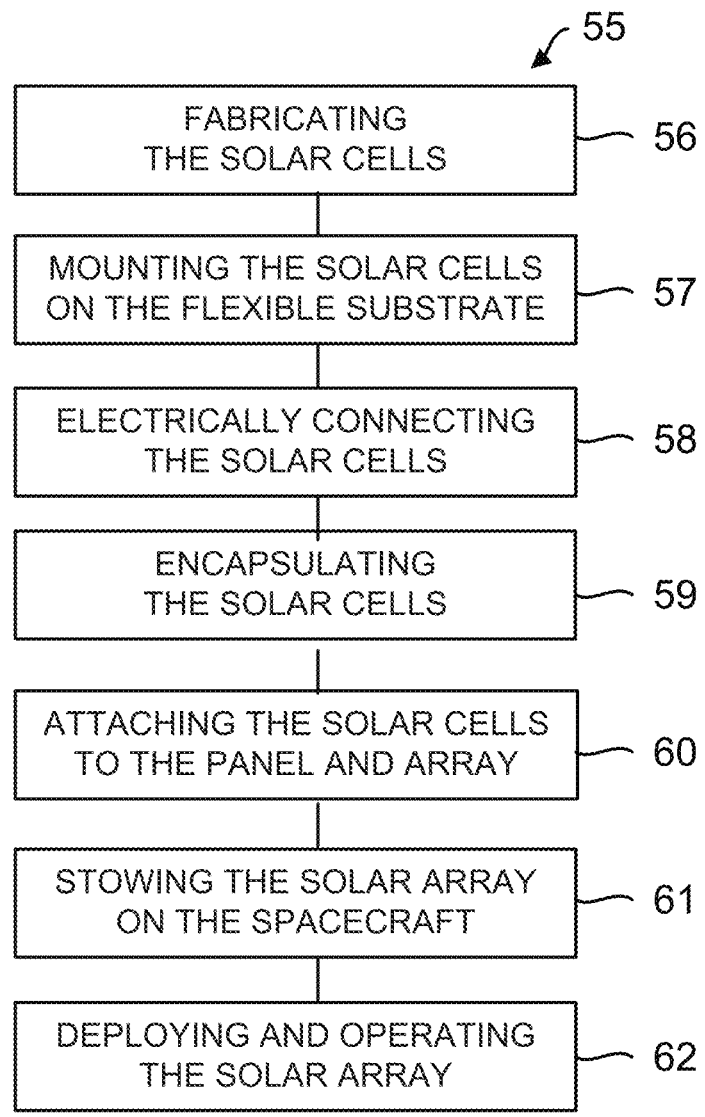
FIG. 12 is a flowchart illustrating a method of making and using the improved solar cells and flexible substrate, according to one example.

FIG. 12 is a flowchart illustrating a method 55 of making and using the improved solar cells 16B and flexible substrate 17B, according to one example.

Block 56 represents the step of fabricating one or more of the solar cells 16B, including the Ge substrate 18, backside metal layer 19 deposited on the Ge substrate 18 to provide a low resistance path to carry current across the solar cell 16B, contacts 21A, 21B on the solar cell 16B and the Ge substrate 18, respectively, for making electrical connections, and the backside insulator 31 deposited on the backside metal layer 19 to insulate the backside metal layer 19. The backside insulator 31 provides an insulation layer over an entire backside surface of the solar cell 16B, the solar cell 16B is placed directly over the traces 34A, and the backside insulator 31 provides an insulation layer for the traces 34A.

Block 57 represents the step of mounting the solar cells 16B on the flexible substrate 17B using the adhesive 32, wherein the flexible substrate 17B is comprised of the at least one polymer backsheet 33 and the at least one metal conductive layer 34 patterned on the surface of the polymer backsheet 33 as the one or more traces 34A, 34B, 34C for making electrical connections with the solar cells 16B.

Block 58 represents the step of electrically connecting the solar cells 16B mounted on the flexible substrate 17B, wherein the metal foil interconnects 20 are welded to and electrically connect contacts 21A, 21B on the solar cell 16B and the Ge substrate 18, respectively, and the metal foil interconnects 20 are also welded to and electrically connect the traces 34A, 34B and 34C on the flexible substrate 17B. In other examples, the metal foil interconnects 20 can be ultrasonically bonded to, wire bonded to, printed on, etc., to the contacts 21A, 21B, and the traces 34A, 34B, 34C.

Block 59 represents the step of encapsulating the entire assembly comprised of the solar cells 16B mounted on the flexible substrate 17B and the metal foil interconnects 20 using the spray-on transparent insulator overcoat 36B. The spray-on transparent insulator overcoat 36B provides transparent insulation through encapsulation of the solar cell 16.

Block 60 represents the step of attaching the entire assembly to the solar panel 12 of the solar array 11. In one example, the solar array 11 or panel 12 is a rollable solar array 11 or solar panel 12 having a reduced stress energy and a reduced minimum rolling radius as compared to a baseline solar cell 16A mounted on a baseline flexible substrate 17A. Specifically, the solar array 11 or solar panel 12 has a reduction in overall thickness by at least 36% and reduced stress energy of about 2%.

Block 61 represents the step of stowing the solar array 11 on the spacecraft 10 using mechanisms that allow the solar arrays 11 and solar panels 12 to be attached to the spacecraft 10 and then rolled, folded, or otherwise compacted for stowing during launch.

Block 62 represents the step of deploying and operating the solar array 11 from the spacecraft 10 following launch.

CONCLUSION

The description of the examples set forth above has been presented for purposes of illustration and description, and is not intended to be exhaustive or limited to the examples described. Many alternatives, modifications and variations may be used in place of the specific elements described above.

What is claimed is:
1. A method, comprising:
   mounting at least one solar cell to a flexible substrate using an adhesive, wherein:
   the flexible substrate includes at least one insulating layer and at least one conductive layer patterned on the at least one insulating layer as one or more traces for making electrical connections with the at least one solar cell;
   the one or more traces on the flexible substrate are unencapsulated and at least one of the one or more traces remain exposed after the at least one solar cell is mounted to the flexible substrate; and
   the at least one solar cell is positioned above the one or more traces on the flexible substrate resulting in a gap between the one or more traces and the at least one solar cell, so that a backside metal layer of the at least one solar cell does not make contact to the one or more traces on the flexible substrate when the at least one solar cell is mounted on the flexible substrate.

2. The method of claim 1, wherein the at least one solar cell includes a Germanium (Ge) substrate with the backside metal layer to provide path to carry current across the at least one solar cell, and a backside insulator deposited on the backside metal layer to insulate the backside metal layer.

3. The method of claim 2, wherein at least one of the one or more traces is electrically connected to the backside metal layer of the at least one solar cell using an interconnect.

4. The method of claim 1, wherein the adhesive is positioned adjacent to the one or more traces on the flexible substrate when mounting the at least one solar cell on the flexible substrate.

5. The method of claim 1, wherein a solar array or panel comprised of the at least one solar cell mounted to the flexible substrate has a thickness of 0.008".

6. The method of claim 5, wherein:
   the one or more traces comprise a 1 oz copper layer having a thickness of 0.0014";
   the adhesive has a thickness of 0.0023";
   the at least one solar cell is positioned 0.0009" above the one or more traces of the flexible substrate; and
   wherein the at least one solar cell has a thickness less than 0.006".

7. The method of claim 5, wherein the solar array or panel is a rollable solar array or panel comprised of the at least one solar cell mounted to the flexible substrate.

8. The method of claim 1, wherein contacts are placed on a front side of the at least one solar cell.

9. The method of claim 1, wherein a backside insulator provides an insulation layer over an entire backside surface of the at least one solar cell, and the at least one solar cell is placed directly over the one or more traces.

10. The method of claim 1, wherein a spray-on transparent insulator overcoat provides transparent insulation through encapsulation of the at least one solar cell.

11. The method of claim 1, wherein a transparent insulator overcoat is applied to an interconnect connected between the at least one solar cell and at least one of the one or more traces on the flexible substrate.

12. A device, comprising:
- at least one solar cell mounted to a flexible substrate using an adhesive, wherein:
- the flexible substrate includes at least one insulating layer and at least one conductive layer patterned on the at least one insulating layer as one or more traces for making electrical connections with the at least one solar cell;
- the one or more traces on the flexible substrate are unencapsulated and at least one of the one or more traces remain exposed after the at least one solar cell is mounted to the flexible substrate; and
- the at least one solar cell is positioned above the one or more traces on the flexible substrate resulting in a gap between the one or more traces and the at least one solar cell, so that a backside metal layer of the at least one solar cell does not contact the one or more traces on the flexible substrate when the at least one solar cell is mounted on the flexible substrate.

13. The device of claim 12, wherein the at least one solar cell includes a Germanium (Ge) substrate with the backside metal layer to provide a path to carry current across the at least one solar cell, and a backside insulator deposited on the backside metal layer to insulate the backside metal layer.

14. The device of claim 13, wherein at least one of the one or more traces is electrically connected to the backside metal layer of the at least one solar cell using an interconnect.

15. The device of claim 12, wherein the adhesive is positioned adjacent to the one or more traces on the flexible substrate when mounting the at least one solar cell on the flexible substrate.

16. The device of claim 12, wherein a solar array or panel comprised of the at least one solar cell mounted to the flexible substrate has a thickness of 0.008".

17. The device of claim 12, wherein:
- the one or more traces comprise a 1 oz copper layer having a thickness of 0.0014";
- the adhesive has a thickness of 0.0023";
- the at least one solar cell is positioned 0.0009" above the one or more traces of the flexible substrate; and
- wherein the at least one solar cell has a thickness less than 0.006".

18. The device of claim 16, wherein the solar array or panel is a rollable solar array or panel comprised of the at least one solar cell mounted to the flexible substrate.

19. The device of claim 12, wherein contacts are placed on a front side of the at least one solar cell.

20. The device of claim 12, wherein a backside insulator provides an insulation layer over an entire backside surface of the at least one solar cell, and the at least one solar cell is placed directly over the one or more traces.

21. The device of claim 12, wherein a spray-on transparent insulator overcoat provides transparent insulation through encapsulation of the at least one solar cell.

22. The device of claim 12, wherein a transparent insulator overcoat is applied to an interconnect connected between the at least one solar cell and at least one of the one or more traces on the flexible substrate.

23. A method, comprising:
- stowing, deploying, or operating at least one solar cell mounted to a flexible substrate using an adhesive, wherein:
- the flexible substrate includes at least one insulating layer and at least one conductive layer patterned on the at least one insulating layer as one or more traces for making electrical connections with the at least one solar cell;
- the one or more traces on the flexible substrate are unencapsulated and at least one of the one or more traces remain exposed after the at least one solar cell is mounted to the flexible substrate;
- the at least one solar cell is positioned above the one or more traces on the flexible substrate resulting in a gap between the one or more traces and the at least one solar cell, so that a backside metal layer of the at least one solar cell does not make contact to the one or more traces on the flexible substrate when the at least one solar cell is mounted on the flexible substrate.

* * * * *